US007236389B2

(12) United States Patent
Hsu

(10) Patent No.: US 7,236,389 B2
(45) Date of Patent: Jun. 26, 2007

(54) CROSS-POINT RRAM MEMORY ARRAY HAVING LOW BIT LINE CROSSTALK

(75) Inventor: Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 13 days.

(21) Appl. No.: 11/283,135

(22) Filed: Nov. 17, 2005

(65) Prior Publication Data
US 2007/0109835 A1     May 17, 2007

(51) Int. Cl.
*G11C 11/00* (2006.01)

(52) U.S. Cl. .................. 365/148; 365/205; 365/207; 365/158

(58) Field of Classification Search ........... 365/148, 365/205, 207, 158
See application file for complete search history.

(56) References Cited

U.S. PATENT DOCUMENTS 6,490,190 B1 * 12/2002 Ramcke et al. ............. 365/158
6,753,561 B1   6/2004 Rinerson et al.
6,858,905 B2 *  2/2005 Hsu et al. ................... 257/385
2004/0170048 A1 *  9/2004 Hsu ............................ 365/148
2005/0128796 A1 *  6/2005 Hoffmann ................... 365/158

* cited by examiner

*Primary Examiner*—Richard T. Elms
*Assistant Examiner*—Toan Le
(74) *Attorney, Agent, or Firm*—Robert D. Varitz, PC

(57) ABSTRACT

A cross-point RRAM memory array includes a word line array having an array of substantially parallel word lines therein and a bit line array having an array of substantially parallel bit lines therein, wherein said bit lines are substantially perpendicular to said word lines, and wherein a cross-point is formed between said word lines and said bit lines. A memory resistor located between said word lines and said bit lines at each cross-point. A high-open-circuit-voltage gain, bit line sensing differential amplifier circuit located on each bit line, including a feedback resistor and a high-open-circuit-voltage gain amplifier, arranged in parallel, wherein a resistance of the feedback resistors is greater than a resistance of any of the memory resistors programmed at a low resistance state.

6 Claims, 4 Drawing Sheets

CROSS-POINT RRAM MEMORY ARRAY HAVING LOW BIT LINE CROSSTALK

FIELD OF THE INVENTION

The invention relates to RRAM cross-point three dimensional memory arrays having very low leakage current, and specifically to a RRAM cross-point three dimensional memory array having a high-gain, bit line sensing amplifier on each bit line thereof.

BACKGROUND OF THE INVENTION

Resistance random access memory (RRAM) has a very low voltage switching resistance and may be used as a non-volatile memory resistor in large scale memory arrays. Unfortunately, a single RRAM memory cell is not suitable for use in a cross-point memory array.

U.S. Pat. No. 6,753,561 B1, to Rinerson et al., granted Jun. 22, 2004, for Cross point memory array using multiple thin films, describes a memory array which includes a first group of substantially parallel conductive array lines, a second group of substantially parallel conductive array lines and a plurality of memory plugs. The second group of substantially parallel conductive array lines are oriented to be substantially perpendicular to the first group of parallel conductive lines and the plurality of memory plugs are located at the intersections of the first group of parallel conductive array lines and the second group of parallel conductive array lines. Each memory plug includes multiple layers of thin films, including a thin film layer of a memory element and at least one thin film layer constituting a non-ohmic device, comprising a metal-insulator-metal (MIM) device. Insertion of a current limiter in each of the memory resistor has been proposed by Rinerson et al., supra, to resolve this problem. However, the current limiter increases the process complexity and the circuit reliability.

An equivalent circuit of a prior art cross-point memory array is shown in FIG. 1, generally at 10, wherein an array having bit lines, $B_1$, $B_2$, $B_3$ and $B_4$, cross talk paths is shown. When a voltage, VR, is applied to a word line, a resistor, e.g., $R_{34}$, on bit line $B_4$ is programmed, however, cross-talk is generated between $B_4$ and adjacent bit lines. Bit line cross talk is a very serious problem, because cross talk may completely distort memory signal output.

A Sharp Laboratories of America internal document of S. T. Hsu et al., for and T. K. Li, for *Very High Density Cross-Point Resistor Memory Array with MSM/PCMO memory cell*, submitted on May 5, 2005, discloses a metal-semiconductor-metal (MSM) current limiter which is inserted to each memory cell. The MSM described in that document has back-to-back Schottky diodes and is able to handle larger current than the MIM diodes of Rinerson et al., supra.

SUMMARY OF THE INVENTION

A cross-point RRAM memory array includes a word line array having an array of substantially parallel word lines therein and a bit line array having an array of substantially parallel bit lines therein, wherein said bit lines are substantially perpendicular to said word lines, and wherein a cross-point is formed between said word lines and said bit lines. A memory resistor located between said word lines and said bit lines at each cross-point. A high-gain, bit line sensing amplifier circuit located on each bit line, including a feedback resistor and a high-gain differential amplifier, arranged in parallel, wherein a resistance of the feedback resistors is greater than a resistance of any of the memory resistors programmed at the low resistance state. The feedback resistor may have a resistance smaller than the resistance of the memory resistors programmed to the high resistance state.

It is an object of the invention to provide circuit technology which results in a RRAM cross-point three dimensional memory array having very low leakage current.

Another object of the invention is to provide a RRAM cross-point three dimensional memory array having a high-gain, bit line sensing amplifier on each bit line.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The primary purpose of the 3D cross-point resistor memory array of the invention is to eliminate cross talk between bit lines. In the RRAM memory array of the invention, a high-open-circuit voltage gain amplifier is used as a bit line sensing differential amplifier. Because the input voltage of such a high gain amplifier is about zero, the cross talk among bit lines is minimized. The open circuit gain of the amplifier must be higher than 100 and a proper feedback resistor, having a resistance larger than the resistance of the memory resistor of the array at the low resistance state, is provided as part of the circuit.

Figure 1:
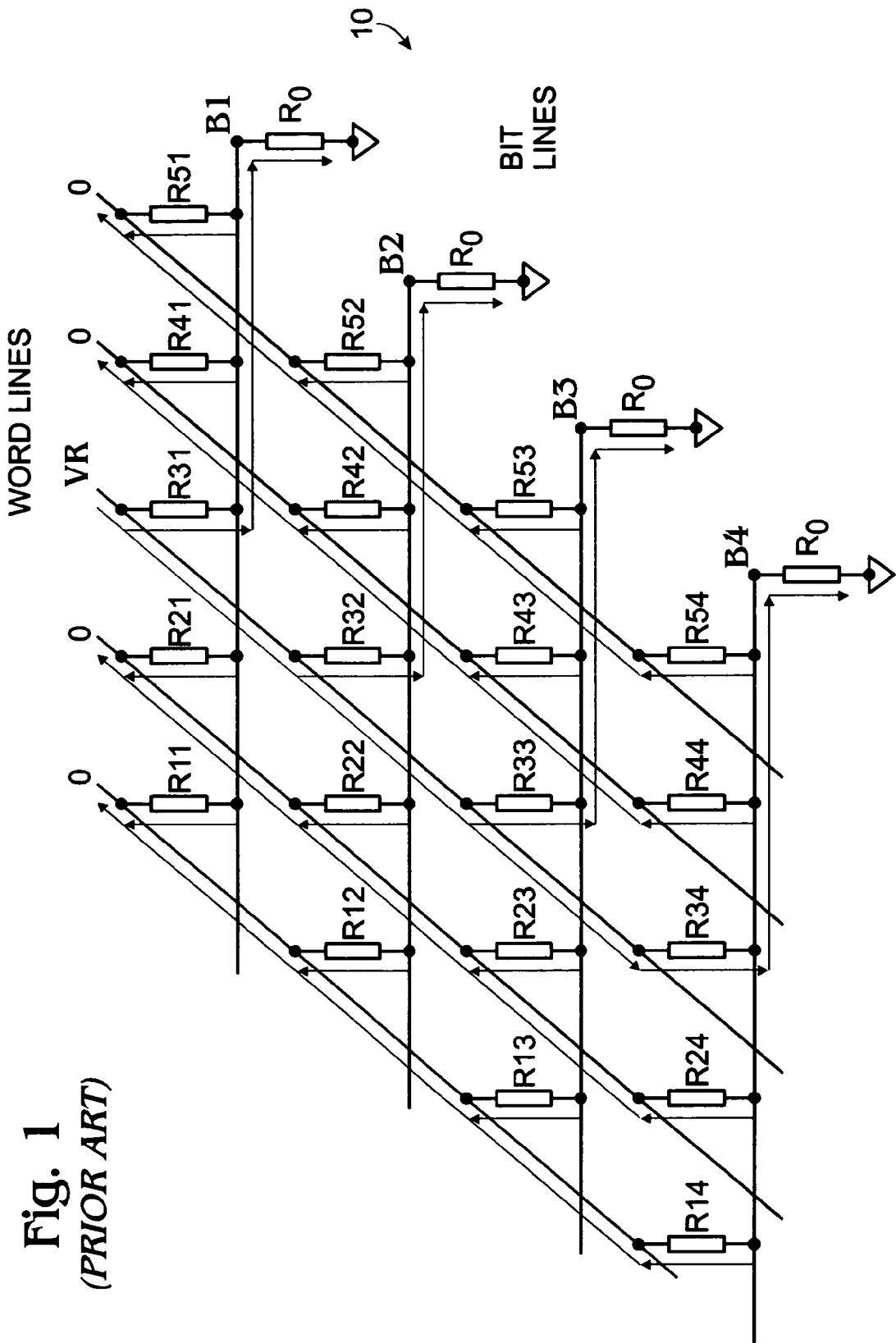
FIG. 1 depicts a prior art equivalent circuit of a cross-point resistor memory array having bit lines with cross talk paths.
Figure 2:
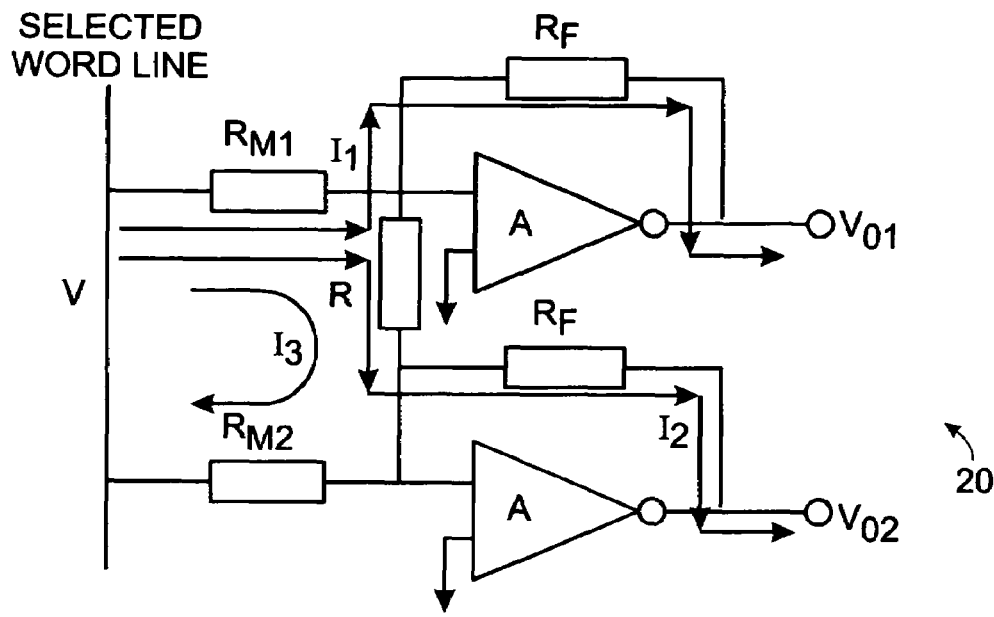
FIG. 2 depicts an equivalent circuit of two adjacent bit lines having bit-sensing amplifiers.

The equivalent circuit of two-adjacent bit lines is depicted in FIG. 2, generally at 20. The circuit includes amplifiers, A, $R_{M1}$ and $R_{M2}$ are the memory resistors, $R_F$ are the feedback resistors, where R is the equivalent of all unselected memory resistors connected to the given bit lines, and V is the selected word line voltage and $V_{o1}$ and $V_{o2}$ are the output voltage of bit line 1 and bit line 2, respectively. $I_1$ is the current form a word line through a memory resistor to a bit line, and $I_2$ is leakage current, responsible for cross talk.

The current equations are:

$$V = I_1(R_{M1}+R_F)+I_3 R_{M1}+V_{O1} \qquad (1)$$

$$V = I_2(R_{M2}+R_F)+I_3 R_{M3}+V_{O2} \qquad (2)$$

$$I_1 R_F = V_{O1} - V_{i1} = V_{O1}\left(1 - \frac{1}{A}\right) \qquad (3)$$

$$I_2 R_F = V_{O2} - V_{i2} = V_{O2}\left(1 - \frac{1}{A}\right) \text{ and} \qquad (4)$$

-continued $$I_3 = \frac{V_{01} - V_{02}}{AR} \quad (5)$$

Equations 1–5 yield:

$$V - \left(I_1 + \frac{V_{01} - V_{02}}{AR}\right) R_{M1} = \frac{V_{01}}{A} = V - \left(\frac{V_{01}}{R_F}\left(1 - \frac{1}{A}\right) + \frac{V_{01} - V_{02}}{AR}\right) R_{M1} \quad (6)$$

$$V - \left(I_2 - \frac{V_{01} - V_{02}}{AR}\right) R_{M2} = \frac{V_{02}}{A} = V - \left(\frac{V_{02}}{R_F}\left(1 - \frac{1}{A}\right) + \frac{V_{01} - V_{02}}{AR}\right) R_{M2} \quad (7)$$

From Eq 6 and Eq 7, the relationship between output voltages is defines as:

$$\frac{V_{01}}{V_{02}} = \frac{R_F(R + R_{M1} + R_{M2}) + R_{M2}(A-1)}{R_F(R + R_{M1} + R_{M2}) + R_{M1}(A-1)} \quad (8)$$

Figure 3:
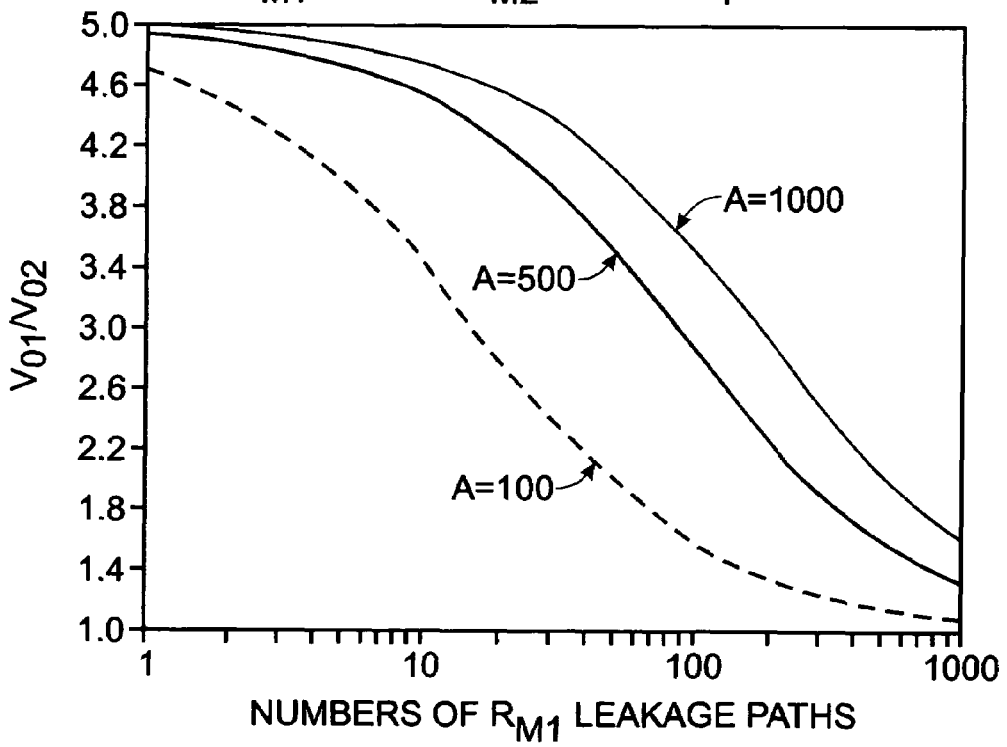
FIG. 3 depicts output voltages of a cross-point RRAM constructed according to the invention which includes a 1K ohm $R_{M1}$ resistor and a 5 K ohm $R_{M2}$ resistor.
Figure 4:
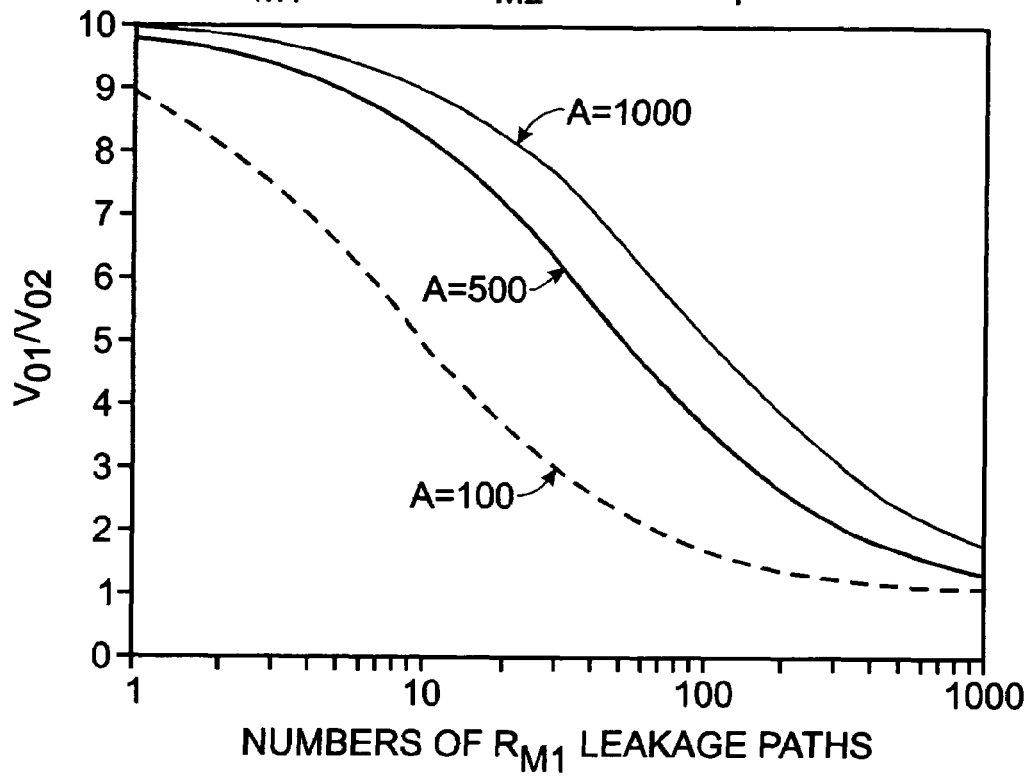
FIG. 4 depicts output voltages of a cross-point RRAM constructed according to the invention which includes a 1K ohm $R_{M1}$ resistor and a 10 K ohm $R_{M2}$ resistor.

Equation 8 is plotted, in FIG. 3 for $R_{M2}=5R_{M1}=5$ K ohm, and, in FIG. 4 for $R_{M2}=10R_{M1}=10$ K ohm, as a function of numbers of leakage paths with minimum resistance of with open circuit amplifier gain as a parameter. The resistance of the feedback resistor is 2K ohm. These results demonstrate that when the open circuit voltage gain is larger than 500, and the output voltage ratio of about 2.8 and 4, respectively, if there is 100 minimum leakage resistor pairs. When the open circuit voltage gain is 1000, this ratio is about 3.5 and 5.4, respectively. This clearly demonstrates that the output voltage ratio increases with the open circuit voltage gain of the sensing amplifier and the high-to-low resistance ratio of the memory resistors. By properly design the sensing amplifier, a large cross-point RRAM array may be fabricated without the need to provide a current limiter.

Figure 6:
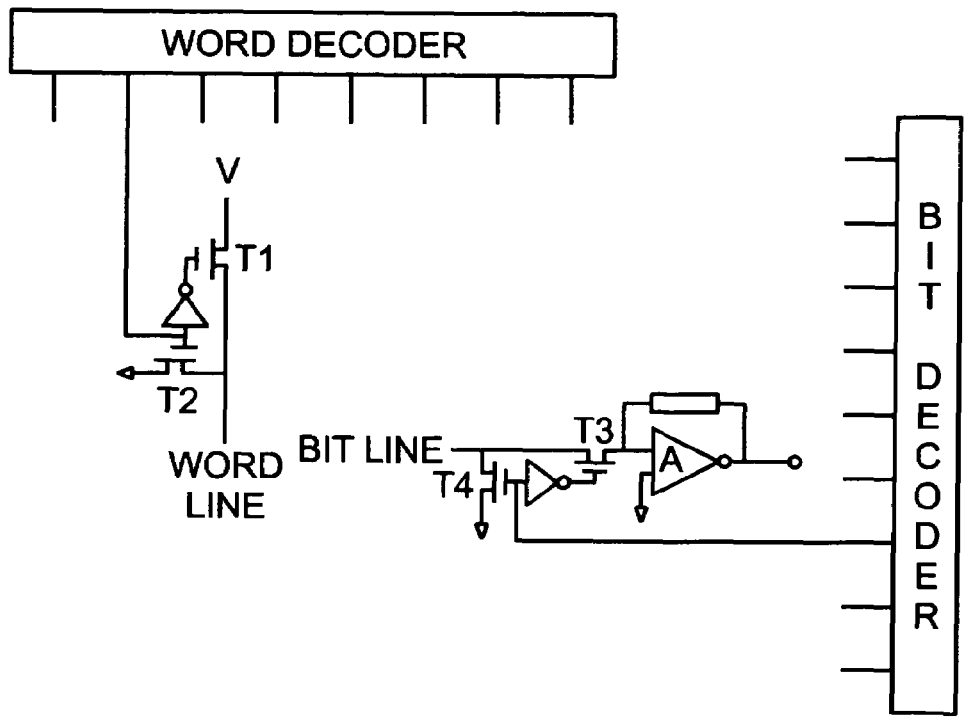
FIG. 6 depicts reading of a bit memory content.
Figure 5:
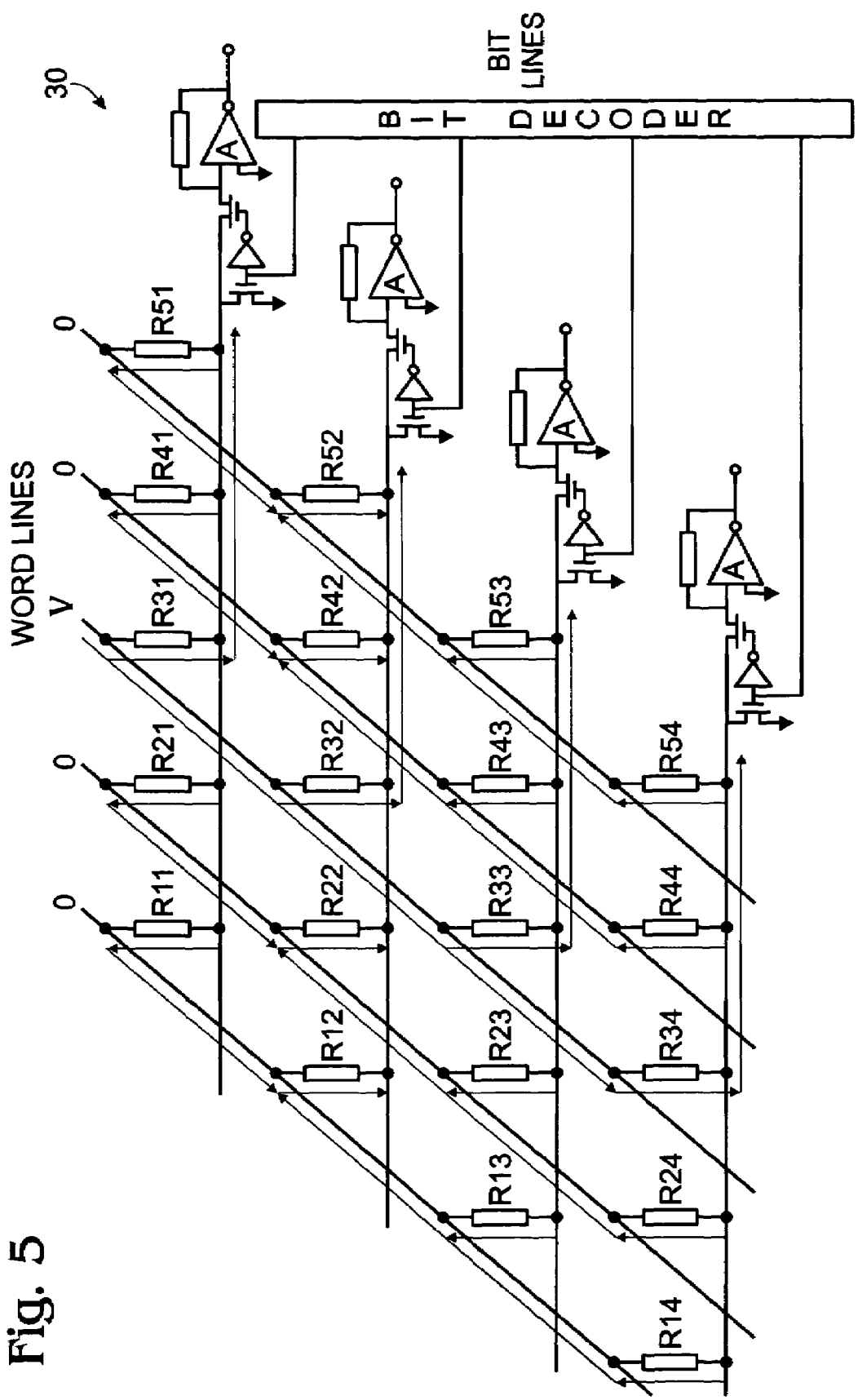
FIG. 5 depicts the memory array of the invention configured in a "read one word at a time" mode.

Because the voltage at the bit line is virtually equal to the ground potential, the memory array may be read one word at a time, as depicted in FIG. 5, generally at 30. Array 30 has substantially parallel word lines and bit lines therein, wherein the bit lines are substantially perpendicular to the word lines. a cross-point is formed where a word line crosses a bit line, and a memory resistor is located at each cross-point in the array. During a read operation, the unselected word line is preferred to be biased to the ground potential. The array may also be read one bit at a time, as depicted in FIG. 6, where T2 and T4 are shunt transistors and $T_1$ and $T_3$ are pass transistors. When a given word line and a given bit line are selected, $T_1$ and $T_3$ are on while $T_2$ and $T_4$ are off, allowing the word line to be biased with voltage V and the output of the selected bit line to be connected to the sensing amplifier. For unselected word and bit lines, $T_1$ and $T_3$ are off, while $T_2$ and $T_4$ are on. Thus, both all unselected word lines and all unselected bit lines are at the ground potential.

Thus, a circuit for eliminating cross talk between bit lines in a cross-point RRAM memory array has been disclosed. It will be appreciated that further variations and modifications thereof may be made within the scope of the invention as defined in the appended claims.

I claim:

1. A cross-point RRAM memory array comprising:
   a word line array having an array of substantially parallel word lines therein;
   a bit line array having an array of substantially parallel bit lines therein, wherein said bit lines are substantially perpendicular to said word lines, and wherein a cross-point is formed between said word lines and said bit lines;
   a memory resistor located between said word lines and said bit lines at each cross-point; and
   a high-open-circuit-voltage gain, bit line sensing differential amplifier circuit located on each bit line, including a feedback resistor and a high-gain amplifier, arranged in parallel, wherein a resistance of said feedback resistor is greater than a resistance of any of said memory resistors when said memory resistors are programmed at a low resistance state.

2. The RRAM memory array of claim 1 wherein, for adjacent bit lines, $I_1$ is a current through a first bit line, $I_2$ is a current through an adjacent, second bit line, and $I_3$ is a leakage current between the first bit line and the second bit line, and wherein $I_3$ is much smaller than $I_2$ or $I_1$.

3. The RRAM memory array of claim 1 wherein, for adjacent bit lines, $V_{i1}$ is a voltage passing through a memory resistor from a first word line to a first bit line, $V_{i2}$ is a voltage passing through an adjacent memory resistor to a second bit line, where $$V_{i1} = \frac{V_{01}}{A} \text{ and } V_{i2} = \frac{V_{02}}{A}$$

are the high-gain bit line sensing amplifier circuit input voltages, wherein, when A is larger than 100, $V_{i1}$ and $V_{i2}$ are negligibly small compared to V at the word line input.

4. A cross-point RRAM memory array comprising:
   a word line array having an array of substantially parallel word lines therein;
   a bit line array having an array of substantially parallel bit lines therein, wherein said bit lines are substantially perpendicular to said word lines, and wherein a cross-point is formed between said word lines and said bit lines;
   a memory resistor located between said word lines and said bit lines at each cross-point; and
   a high-open-circuit-voltage gain, bit line sensing differential amplifier circuit located on each bit line, including a feedback resistor and a high-gain amplifier, arranged in parallel, wherein a resistance of said feedback resistor is smaller than a resistance of any of said memory resistors when said memory resistors are programmed at a high resistance state.

5. The RRAM memory array of claim 4 wherein, for adjacent bit lines, $I_1$ is a current through a first bit line, $I_2$ is a current through an adjacent, second bit line, and $I_3$ is a leakage current between the first bit line and the second bit line, and wherein $I_3$ is much smaller than $I_2$ or $I_1$.

6. The RRAM memory array of claim 4 wherein, for adjacent bit lines, $V_{i1}$ is a voltage passing through a memory resistor from a first word line to a first bit line, $V_{i2}$ is a voltage passing through an adjacent memory resistor to a second bit line, where $$V_{i1} = \frac{V_{01}}{A} \text{ and } V_{i2} = \frac{V_{02}}{A}$$

are the high-gain bit line sensing amplifier circuit input voltages, wherein, when A is larger than 100, $V_{i1}$ and $V_{i2}$ are negligibly small compared to V at the word line input.

* * * * *